(12) United States Patent
Jun et al.

(10) Patent No.: US 8,026,508 B2
(45) Date of Patent: Sep. 27, 2011

(54) SEMICONDUCTOR DEVICE AND METHOD OF FABRICATING THE SAME

(75) Inventors: Myung-Sim Jun, Daejeon (KR);
Moon-Gyu Jang, Daejeon (KR);
Tae-Gon Noh, Daejeon (KR);
Tae-Moon Roh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 14 days.

(21) Appl. No.: 12/498,402

(22) Filed: Jul. 7, 2009

(65) Prior Publication Data
US 2010/0155703 A1   Jun. 24, 2010

(30) Foreign Application Priority Data
Dec. 22, 2008   (KR) .................. 10-2008-0131061

(51) Int. Cl.
*H01L 33/00* (2010.01)
*H01L 29/78* (2010.01)
(52) U.S. Cl. ............... 257/20; 257/21; 257/17; 257/24; 257/E31.082; 257/E31.032; 977/937; 977/953
(58) Field of Classification Search ............ 257/20
See application file for complete search history.

(56) References Cited

U.S. PATENT DOCUMENTS

| 5,665,979 | A  | * | 9/1997 | Takahashi et al. | 257/30 |
| 7,199,372 | B2 |   | 4/2007 | Kardynal et al.  |        |
| 7,351,997 | B2 | * | 4/2008 | Ofek             | 257/39 |
| 2008/0246021 | A1 | * | 10/2008 | Suk et al.     | 257/24 |

FOREIGN PATENT DOCUMENTS
KR     1020060001986 A     1/2006

OTHER PUBLICATIONS

Akira Fujiwara, et al; "Detection of single charges and their generation-recombination dynamics in Si nanowires at room temperature", Applied Physics Letters, vol. 80, No. 24, Jun. 17, 2002, pp. 4567-4569.

* cited by examiner

*Primary Examiner* — Jerome Jackson, Jr.
(74) *Attorney, Agent, or Firm* — Ladas & Parry LLP

(57) ABSTRACT

Provided are a semiconductor device and a method of fabricating the same. The semiconductor device includes: a single electron box including a first quantum dot, a charge storage gate on the first quantum dot, and a first gate electrode on the charge storage gate, the charge storage gate exchanging charges with the first quantum dot, the first gate electrode adjusting electric potential of the first quantum dot; and a single electron transistor including a second quantum dot below the first quantum dot, a source, a drain, and a second gate electrode below the second quantum dot, the second quantum dot being capacitively coupled to the first quantum dot, the source contacting one side of the second quantum dot, the drain contacting the other side facing the one side, the second gate electrode adjusting electric potential of the second quantum dot.

20 Claims, 19 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2008-0131061, filed on Dec. 22, 2008, the entire contents of which are hereby incorporated by reference.

BACKGROUND OF THE INVENTION

The present invention disclosed herein relates to a semiconductor device and a method of fabricating the same, and more particularly, to a semiconductor photon detection device and a method of fabricating the same.

A single photon detection device may be extensively used in various fields such as medical fields, analysis fields of semiconductor and material, imaging fields of chemical analysis, and quantum key distribution and code-breaking fields. An avalanche photodiode (APD) and a photon multiplier tube (PMT) may be used as a single photon detection device. The APD is a detector using amplification of photon and its sensitivity is excellent. However, the APD needs a relatively high several tens of voltage and may malfunction at a high repetition rate.

SUMMARY OF THE INVENTION

The present invention provides a semiconductor device detecting single photon and a method of fabricating the same.

Embodiments of the present invention provide semiconductor devices including: a single electron box including a first quantum dot, a charge storage gate on the first quantum dot, and a first gate electrode on the charge storage gate, the charge storage gate exchanging charges with the first quantum dot, the first gate electrode adjusting electric potential of the first quantum dot; and a single electron transistor including a second quantum dot below the first quantum dot, a source, a drain, and a second gate electrode below the second quantum dot, the second quantum dot being capacitively coupled to the first quantum dot, the source contacting one side of the second quantum dot, the drain contacting the other side facing the one side, the second gate electrode adjusting electric potential of the second quantum dot.

In some embodiments, the first quantum dot includes polysilicon and the second quantum dot includes crystalline silicon.

In other embodiments, the first quantum dot or the charge storage gate receives an incident single photon; and the semiconductor device detects the single photon by sensing a change of conductivity of a single electron transistor through a change of electric potential of the second quantum dot according to a change of charge quantity of the first quantum dot due to the single photon.

In still other embodiments, the single electron box further includes a tunnel insulation layer between the charge storage gate and the first quantum dot; and the single electron transistor further includes a gate insulation layer interposed between the source and the second gate electrode, between the drain and the second gate electrode, and between the second quantum dot and the second gate electrode.

In even other embodiments, the first quantum dot has a first width in a first direction and a second width in a second direction perpendicular to the first direction.

In yet other embodiments, the second quantum dot has the same width as the first width and the second width.

In further embodiments, each of the first and second widths is less than about 20 nm.

In still further embodiments, each of the first and second quantum dots has a thickness of less than about 20 nm.

In even further embodiments, the tunnel insulation layer has a thickness of less than about 4 nm on the first quantum dot.

In yet further embodiments, the single electron box further includes a second insulation layer between the first gate electrode and the first quantum dot.

In yet further embodiments, the source and drain include silicide and the charge storage gate includes silicide.

In yet further embodiments, interfaces between the source and drain and the second quantum dot are formed of a Schottky barrier.

In yet further embodiments, the semiconductor devices further include a first insulation layer interposed between the first and second quantum dots and capacitively coupling the first and second quantum dots.

In yet further embodiments, the first insulation layer is aligned to the first quantum dot and the second quantum dot is disposed below the first insulation layer, the first insulation layer having a thickness of about 4 nm to about 10 nm.

In other embodiments of the present invention, semiconductor devices include: a light detecting unit including a single electron transistor, the single electron transistor including a second gate electrode, a second quantum dot on the second gate electrode, and a source and a drain contacting both sides of the second quantum dot, respectively; a light receiving unit including a single electron box, the single electron box including a first quantum dot on the second quantum dot, a charge storage gate on the first quantum dot, and a first gate electrode on the charge storage gate; a first insulation layer interposed between the first and second quantum dots and capacitively coupling the first and second quantum dots; and an light incident unit including an optical element and a light adjusting element, the light incident unit being adjacent to the light receiving unit to allow a single photon to be locally incident to the light receiving unit, the optical element irradiating light, the optical adjusting element having a smaller aperture than a wavelength of the light.

In still other embodiments of the present invention, methods of fabricating a semiconductor device include: forming a first quantum dot on a second gate electrode; forming a charge storage gate on the first quantum dot; forming a second quantum dot between the second gate electrode and the first quantum dot; and forming a source and a drain contacting both sides of the second quantum dot, respectively, wherein the charge storage gate, the second quantum dot, the source, and the drain are simultaneously formed.

In some embodiments, the charge storage gate, the second quantum dot, the source, and the drain are formed by performing a self-aligned silicide process.

In other embodiments, interfaces between the second quantum dot and the source and drain are formed of a Schottky barrier through the silicide process.

In still other embodiments, the forming of the charge storage gate, the second quantum dot, and the source and drain includes: forming a preliminary silicon pattern, a preliminary first quantum dot, and a preliminary first insulation layer on the second gate electrode layer, which have a first width in a first direction and extend in a second direction perpendicular to the first direction; forming a first insulation layer, a first quantum dot, a first tunnel insulation layer, and a charge storage gate pattern on the preliminary silicon pattern, which have both sides facing each other in a second direction perpendicular to the first direction; forming a sidewall insulation layer exposing the charge storage gate pattern and the preliminary silicon pattern by covering the both sides and the preliminary silicon pattern adjacent to the both sides; and forming a charge storage gate, a second quantum dot, and a source and drain contacting both sides of the second quantum dot by performing a silicidation process on the exposed charge storage gate pattern and preliminary silicon pattern.

In even other embodiments, the source and drain extend below the sidewall insulation layer by reacting the preliminary silicon pattern below the sidewall insulation layer through the silicidation process and the second quantum dot is formed below the first insulation layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DESCRIPTION OF PREFERRED EMBODIMENTS

Figure 1:
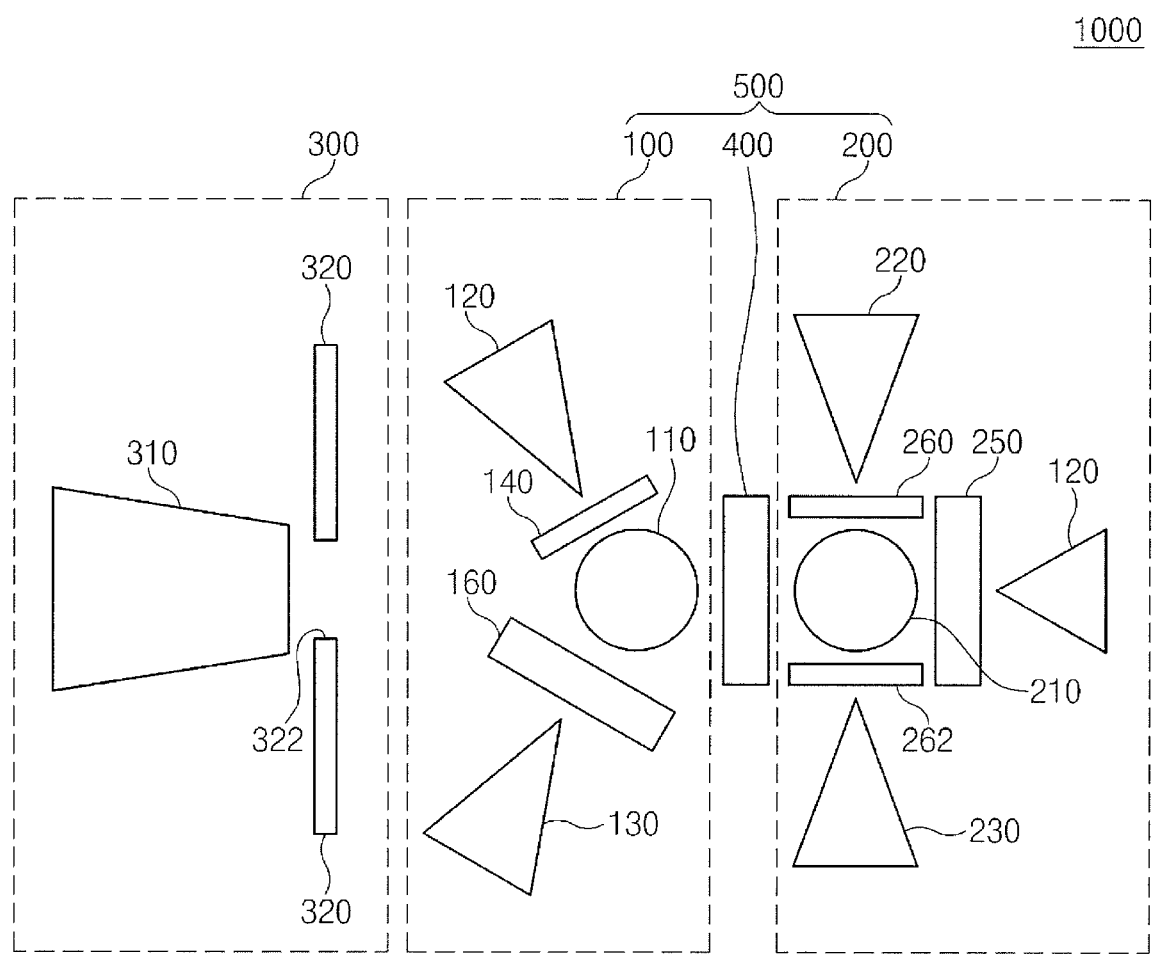
FIG. 1 is a block diagram illustrating a semiconductor device according to an embodiment of the present invention.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, exemplary embodiments of the present invention will be described in detail with reference to the accompanying drawings.

FIG. 1 is a block diagram illustrating a semiconductor device according to an embodiment of the present invention.

Referring to FIG. 1, a semiconductor device 1000 includes a light receiving unit 100, a light detecting unit 200, and a light incident unit 300.

The light incident unit 300 may include an optical element 310 for irradiating light and a light adjusting element 320 including an aperture 322. The aperture 322 may have a smaller diameter than the wavelength of light. A single photon may be locally incident to the light receiving unit 100 by transmitting light into the aperture 322. The light incident unit 300 may be arranged being adjacent to the light receiving unit 100.

The light receiving unit 100 may be defined with a single electron box, and may include an upper gate electrode 130, a charge storage gate 120, and an upper quantum dot 110. The upper quantum dot 110 and the charge storage gate 120 may receive an incident single photon.

The light detecting unit 200 as a single electron transistor may include a lower quantum dot 210, a source 220, a drain 230, and a lower gate electrode 240. The lower quantum dot 210 is capacitively coupled to the upper quantum dot 110. The light detecting unit 200 may detect a change of conductivity of a single electron transistor (i.e., the light detecting unit 200) through a change of electric potential of the lower quantum dot 210, based on a change of charge quantity of the upper quantum dot 110 due to an incident single photon. Accordingly, the light detecting unit 200 may detect a change of charge quantity of the upper quantum dot 110 using an incident single photon. The light detecting unit 200 may be a Schottky barrier single electron transistor. The light detecting unit 200 detects a single photon immediately using a radio frequency-single electron transistor (RF-SET). If a field-effect transistor (not shown) adjacent to the light receiving unit 100 is used instead of a single electron transistor (i.e., the light detecting unit 200), charge distribution of the upper quantum dot 110 in the light receiving unit 100 may affect the conductivity of a channel in the field-effect transistor. Accordingly, the light detecting unit 200 may include a field-effect transistor.

A first insulation pattern 400 is interposed between the upper quantum dot 110 and the lower quantum dot 120. The lower quantum dot 210 may be capacitively coupled to the upper quantum dot 110 through the first insulation pattern 400.

Figure 2A:
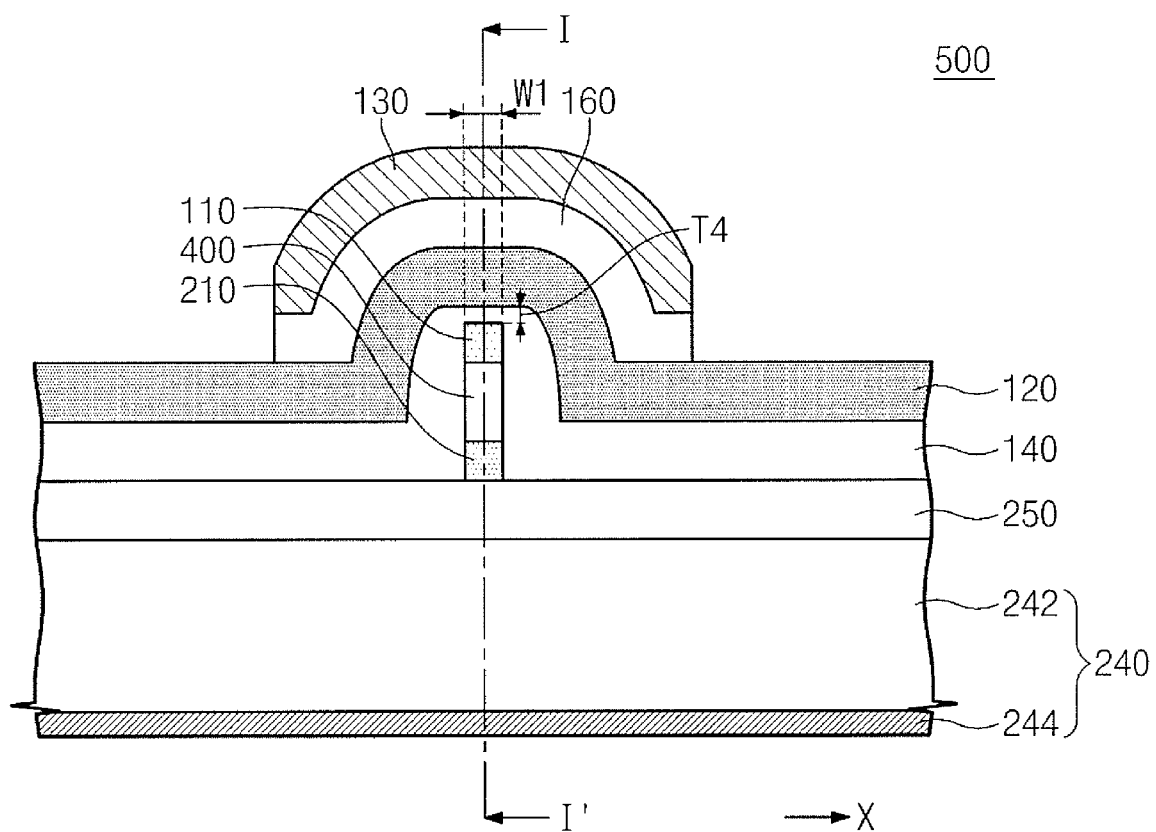
FIG. 2A is a sectional view illustrating a light receiving unit and a light detecting unit according to an embodiment of the present invention.
Figure 2B:
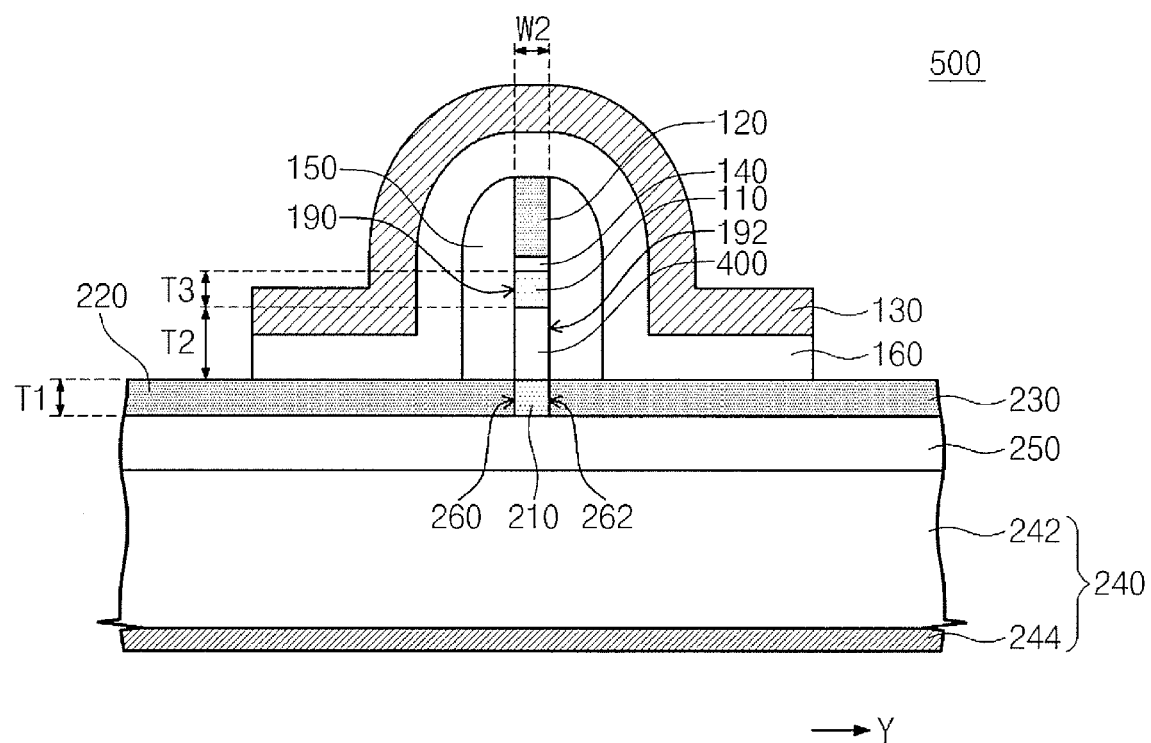
FIG. 2B is a sectional view illustrating the light receiving unit and the light detecting unit taken along the line I-I' of FIG. 2A.

FIG. 2A is a sectional view illustrating a light receiving unit and a light detecting unit according to an embodiment of the present invention. FIG. 2B is a sectional view illustrating the light receiving unit and the light detecting unit taken along the line I-I' of FIG. 2A.

Referring to FIGS. 1, 2A, and 2B, the light receiving unit 100, the light detecting unit 200, and the first insulation pattern 400 may be integrated into one body 500.

The upper quantum dot 110 of the light receiving unit 100 may be disposed on the lower gate electrode 240. The upper quantum dot 110 may include polysilicon. The thickness T3 of the upper quantum dot 110 may below about 20 nm. The upper quantum dot 110 may have the first width W1 in the first direction X and the second width W2 in the second direction Y. Each of the first and second widths W1 and W2 is below about 20 nm. The lower gate electrode 240 may include a lower gate electrode layer 242 and a gate electrode contact layer 244. The gate electrode contact layer 244 may be disposed on the bottom surface of the lower gate electrode layer 242 in order for ohmic contact.

The charge storage gate 120 of the light receiving unit 100 is disposed on the upper quantum dot 110. The charge storage gate 120 may have the second width W2 in the second direction Y. The charge storage gate 120 may include silicide. A tunnel insulation pattern 140 is interposed between the charge storage gate 120 and the upper quantum dot 110. The tunnel insulation pattern 140 may have the second width W2 in the second direction Y. The tunnel insulation pattern 140 may be formed of tetra ethyl ortho silicate (TEOS) layer. The tunnel insulation pattern 140 may have the thickness T4 of less than about 4 nm on the upper quantum dot 110. The charge storage gate 120 serves as a source or a drain to provide charges to the upper quantum dot 110 or to receive charges from the upper quantum dot 110.

The upper gate electrode 130 of the light receiving unit 100 may be disposed on the charge storage gate 120. The upper gate electrode 130 may include metal having excellent conductivity. The upper gate electrode 130 may include Al, Cu, W or indium tin oxide (ITO). The second insulation pattern 160 is interposed between the upper gate electrode 130 and the charge storage gate 120. The sidewall insulation layer 150 may covers both sides of the charge storage gate 120. The sidewall insulation layer 150 and the second insulation pattern 160 have the thickness through which charge cannot pass. Each of the sidewall insulation layer 150 and the second insulation pattern 160 may include TEOS. The electric potential of the upper quantum dot 110 may be adjusted by the upper gate electrode 130 or/and the charge storage gate 120.

The lower quantum dot 210 of the light detecting unit 200 may be interposed between the lower gate electrode 240 and the upper quantum dot 110. The lower quantum dot 210 may include crystalline structure silicon. The thickness T1 of the lower quantum dot 210 is less than about 20 nm. The lower quantum dot 210 has the first width W1 in the first direction X and the second width W2 in the second direction Y. Each of the first and second widths W1 and W2 is below about 20 nm.

The source 220 of the light detecting unit 200 contacts the one side of the lower quantum dot 210 and the drain 230 contacts the other side opposite to the one side. The source and drain 220 and 230 may include silicide. The interfaces 260 and 262 between the lower quantum dot 210 and the source and drain 220 and 230 may form a Schottky barrier. The Schottky barrier is used as a tunneling barrier. The lower gate insulation layer 250 may be interposed between the lower gate electrode 240 and the lower quantum dot 210 and between the lower gate electrode 240 and the source and drain 220 and 230.

The first insulation pattern 400 may be a thermal oxide layer. The thickness T2 of the first insulation pattern 400 may be about 4 nm to about 10 nm. The charge storage gate 120, the tunnel insulation pattern 140, the upper quantum dot 110, and the first insulation pattern 400 may include the both sides 190 and 192 that are opposite to each other in the second direction Y. The sidewall insulation layer 150 may cover the both sidewalls 190 and 192. The sidewall insulation layer 150 may partially cover the source and drain 220 and 230 adjacent to the lower quantum dot 210.

According to the embodiment of the present invention, voltages of the upper gate electrode 130 or/and the charge storage gate 120 may be respectively adjusted. By adjusting the voltage, when a single photon is incident to the upper quantum dot 110 or the charge storage gate 120, a single electron or a single hole by photon-assisted tunneling may easily tunnel between the upper quantum dot 110 and the charge storage gate 120. The tunneling time may be adjusted by the tunnel insulation pattern 140 between the upper quantum dot 110 and the charge storage gate 120.

According to the embodiment of the present invention, the single electron transistor (i.e., the light detecting unit 200) is in a coulomb-blockage (CB) state. In order for the single electron transistor to be in a peak state of coulomb oscillation of high conductivity based on a change of charge quantity of the upper quantum dot 110 according to the incidence of a single photon, voltages of the lower gate electrode 240 and the source and drain 220 and 230 may be respectively adjusted. Accordingly, the light detecting unit 200 may maintain excellent sensitivity. That is, according to a change of charge quantity of the upper quantum dot 110 due to the tunneling of charge, the electric potential of the lower quantum dot 210 may be changed. Accordingly, a semiconductor single photon detecting device 1000 capable of detecting a very small charge quantity of single charge induced by a single photon can be provided.

An operation principle of the semiconductor device according to the embodiment of the present invention will be described.

Figure 3A:
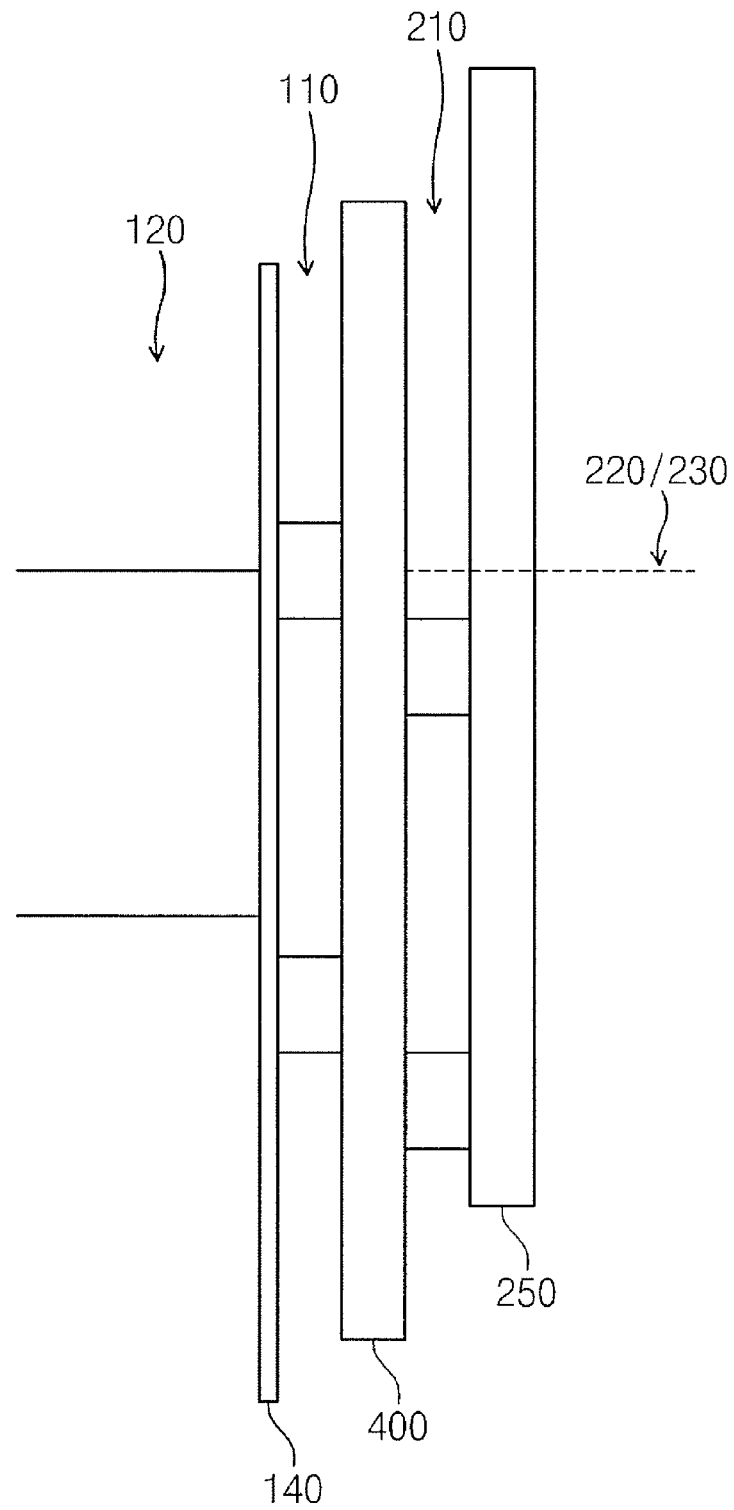
FIGS. 3A and 3B are views illustrating changes of energy levels of a charge storage gate, an upper quantum dot, a lower quantum dot, a source, a drain, and a lower gate insulation layer when a single photon is incident to a charge storage gate of a light receiving unit.
Figure 3B:
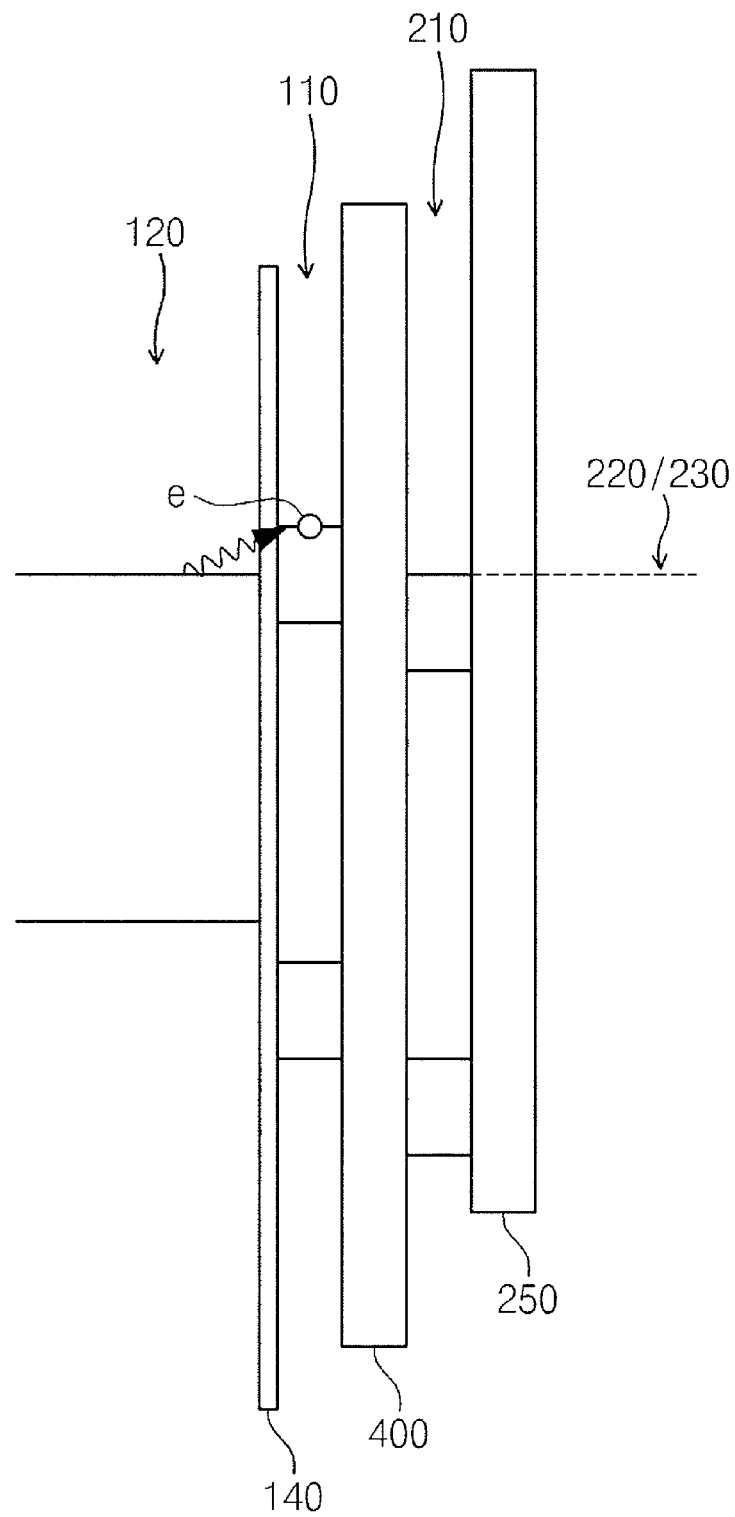

FIGS. 3A and 3B are views illustrating changes of energy levels of a charge storage gate, an upper quantum dot, a lower quantum dot, a source, a drain, and a lower gate insulation layer when a single photon is incident to a charge storage gate of a light receiving unit.

Referring to FIG. 3A, before a single photon is incident to the charge storage gate 120, energy levels of the charge storage gate 120, the upper quantum dot 110, the lower quantum dot 210, and the source/drain 220 and 230 are shown.

Since the energy levels of the source and drain 220 and 230 are off resonance from the energy levels of the lower quantum dot 210, the conductivity of the single electron transistor is low.

Referring to FIG. 3B, when a single electron e (which is caused because a single photon is incident to the charge storage gate 120) tunnels from the charge storage gate 120 to the upper quantum dot 110, energy levels of the charge storage gate 120, the upper quantum dot 110, the lower quantum dot 210, and the source and drain 220 and 230 are shown.

The electric potential of the lower quantum dot 210 is increased when the single electron e tunneling into the upper quantum dot 110, such that the energy level of the lower quantum dot 210 is close to those of the source and drain 220 and 230, and the conductivity of the single electron transistor is increased.

Figure 4A:
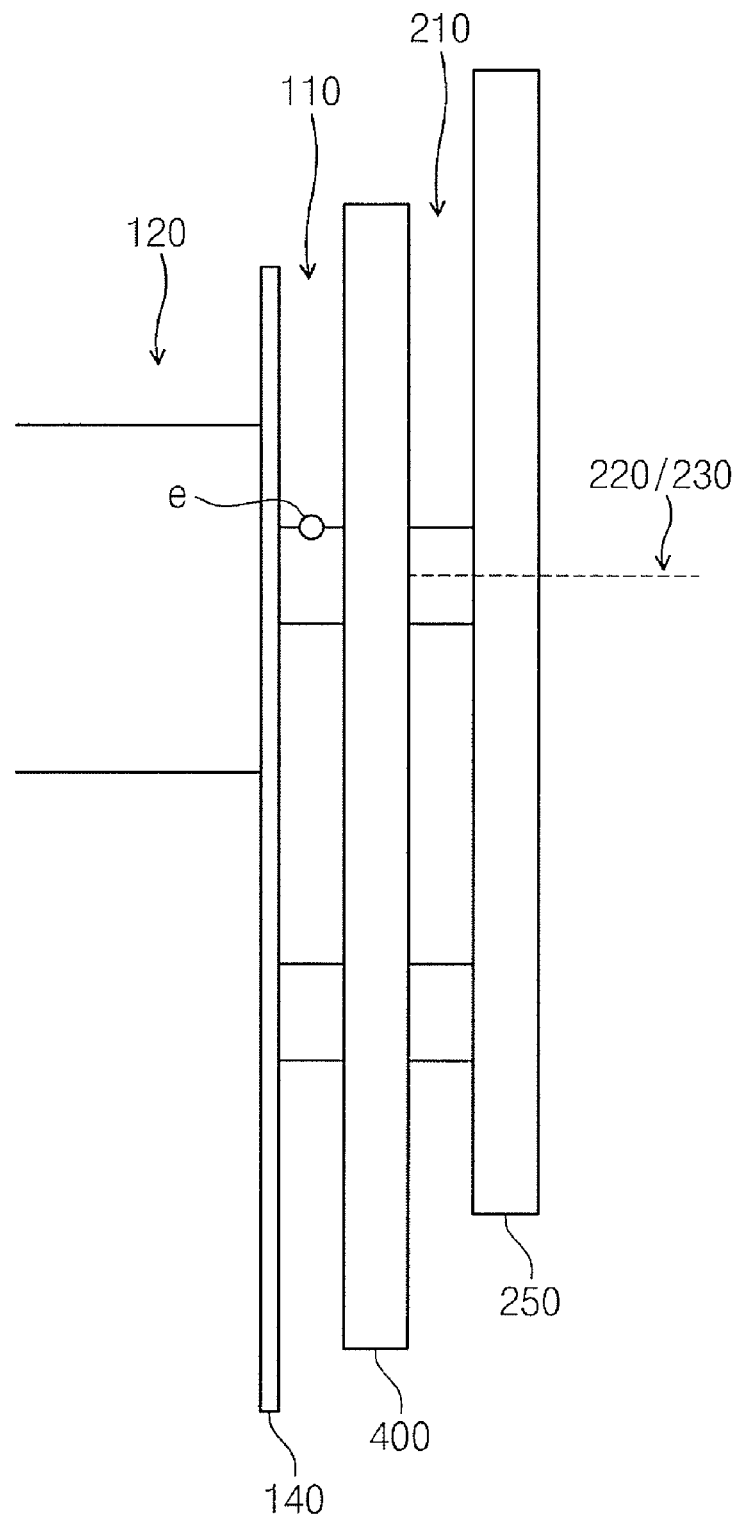
FIGS. 4A and 4B are views illustrating changes of energy levels of a charge storage gate, an upper quantum dot, a lower quantum dot, a source, a drain, and a lower gate insulation layer when a single photon is incident to the upper quantum dot of a light receiving unit according to an embodiment of the present invention.
Figure 4B:
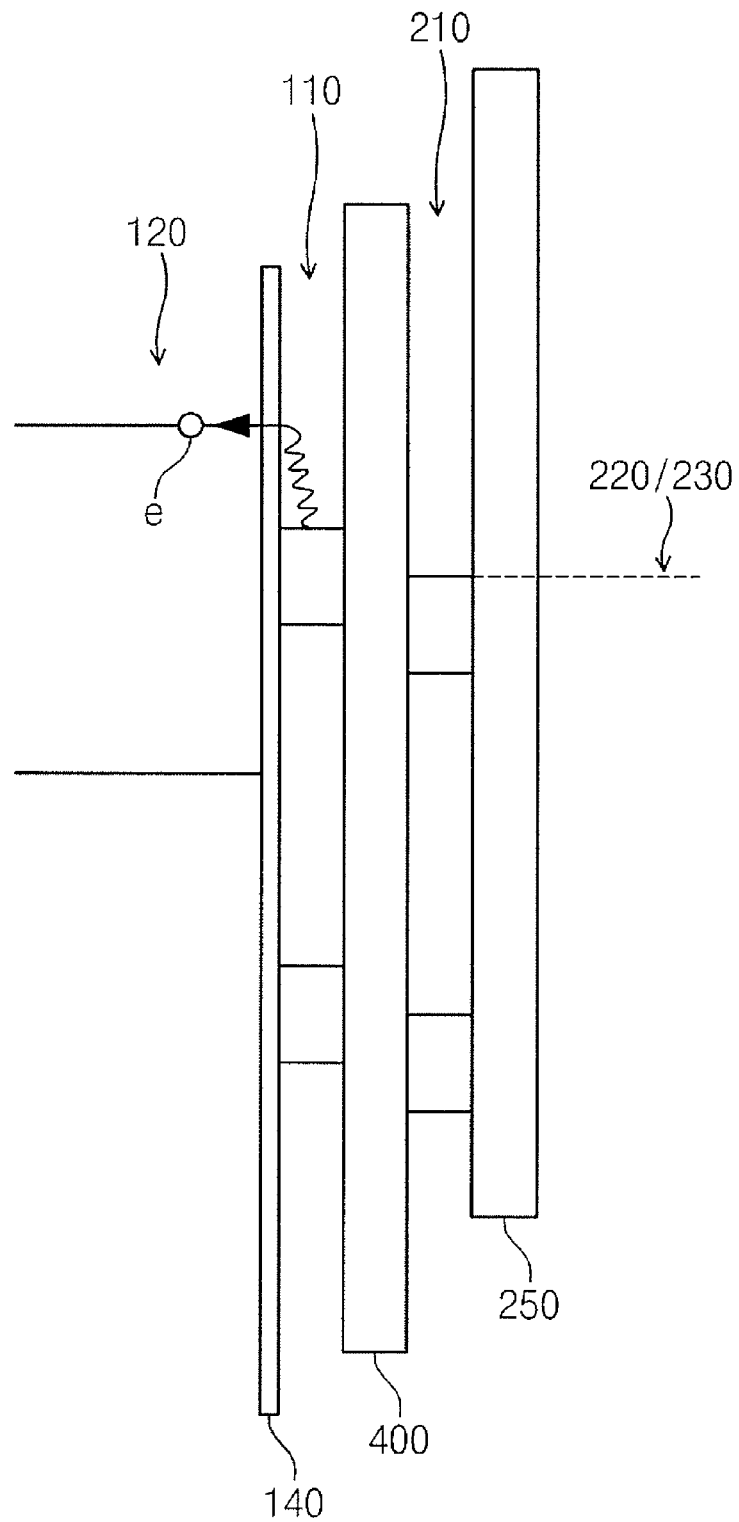

FIGS. 4A and 4B are views illustrating changes of energy levels of a charge storage gate, an upper quantum dot, a lower quantum dot, a source, a drain, and a lower gate insulation layer when a single photon is incident to the upper quantum dot of a light receiving unit according to an embodiment of the present invention.

Referring to FIG. 4A, voltages of the upper gate electrode 130 and the charge storage gate 120 are adjusted such that an energy level of the charge storage gate 120 is higher than that of the upper quantum dot 110. Electron e is filled in the upper quantum dot 110 before a single photon is incident to the upper quantum dot 110.

The energy levels of the source and drain 220 and 230 are off resonance from the energy levels of the lower quantum dot 210, such that conductivity of the single electron transistor is low.

Referring to FIG. 4B, the energy levels of the charge storage gate 120, the upper quantum dot 110, the lower quantum dot 210, and the source and drain 220 and 230 are shown when a single photon is incident to the upper quantum dot 110. Thus single electron e absorbing the energy of the single photon tunnels from the upper quantum dot 110 to the charge storage gate 120.

Due to the single electron e tunneling into the charge storage gate 120, the electric potential of the lower quantum dot 210 is decreased such that the energy level of the lower quantum dot 210 is close to those of the source and drain 220 and 230, and conductivity of the single electron transistor is increased.

FIGS. 5A, 6A, 7A, 8A, 9A, 10A, 11A, 12A, 13A, and 14A are sectional views illustrating a method of fabricating a light receiving unit and a light detecting unit of a semiconductor device according to an embodiment of the present invention. FIGS. 5B, 6B, 7B, 8B, 9B, 10B, 11B, 12B, 13B, and 14B are sectional views taken along the lines I-I' of FIGS. 5A, 6A, 7A, 8A, 9A, 10A, 11A, 12A, 13A, and 14A, respectively.

Figure 5A:
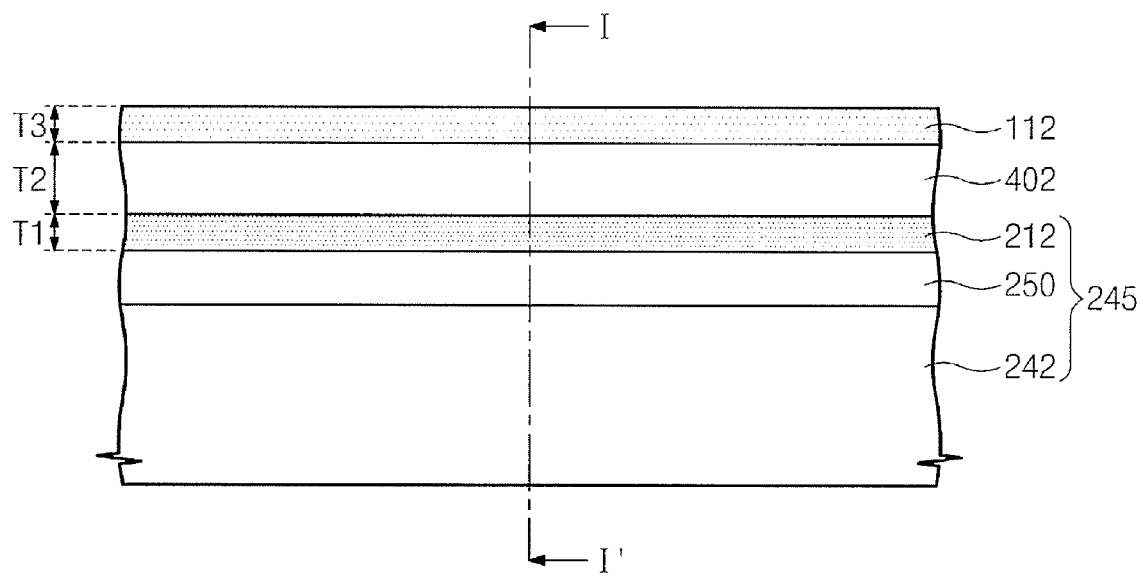
FIGS. 5A, 6A, 7A, 8A, 9A, 10A, 11A, 12A, 13A, and 14A are sectional views illustrating a method of fabricating a light receiving unit and a light detecting unit of a semiconductor device according to an embodiment of the present invention.
Figure 5B:
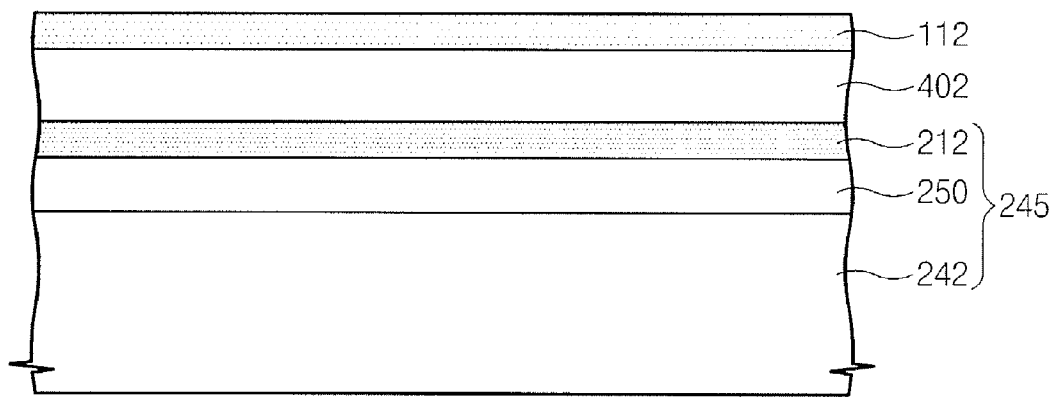
FIGS. 5B, 6B, 7B, 8B, 9B, 10B, 11B, 12B, 13B, and 14B are sectional views taken along the lines I-I' of FIGS. 5A, 6A, 7A, 8A, 9A, 10A, 11A, 12A, 13A, and 14A, respectively.

Referring to FIGS. 5A and 5B, a lower gate electrode layer 242, a lower gate insulation layer 250 on the lower gate electrode layer 242, and a lower silicon layer 212 on the lower gate insulation layer 250 are formed.

For example, provided is a substrate 245 including the lower gate electrode layer 242, the lower gate insulation layer 250, and the lower silicon layer 212. The substrate 245 may be a silicon on insulator (SOI). The lower gate electrode layer 242 may include silicon. The lower gate insulation layer 250 may include a silicon oxide layer. The lower silicon layer 212 may include crystalline structure silicon. The lower silicon layer 212 is formed with the thickness T1 of less than about 20 nm in order to form a quantum dot.

A first insulation layer 402 and an upper quantum dot layer 112 are formed on the lower silicon layer 212. The first insulation layer 402 may be a thermal oxide layer formed through a thermal oxidation process. The first insulation layer 402 may be formed with the thickness of about 4 nm to about 10 nm. The upper quantum dot layer 112 may be a poly silicon layer formed by performing a chemical vapor deposition (CVD) process. The upper quantum dot layer 112 may be formed with the thickness T3 of less than about 20 nm in order to form a quantum dot.

Figure 6A:
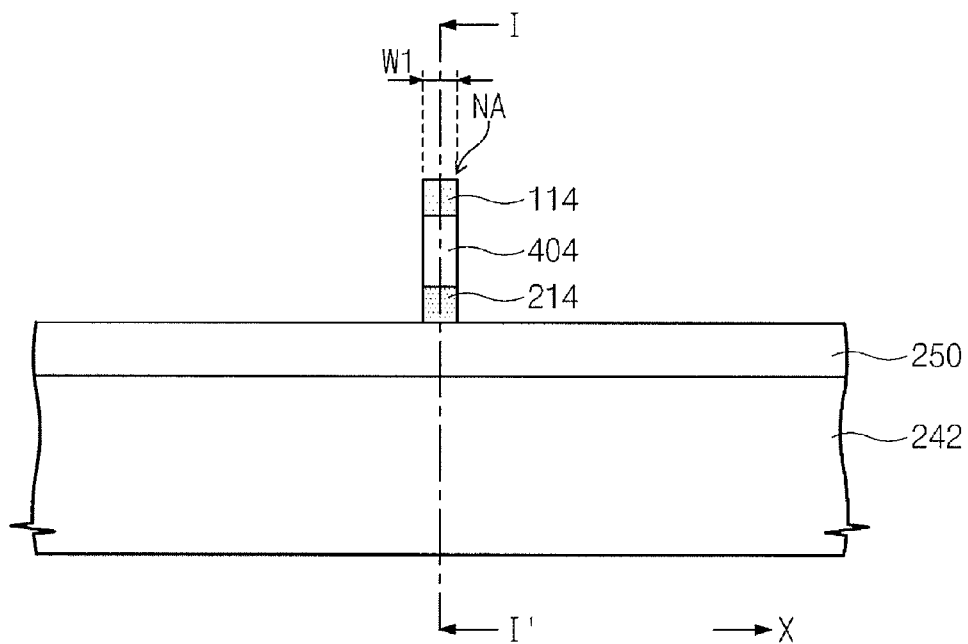
Figure 6B:
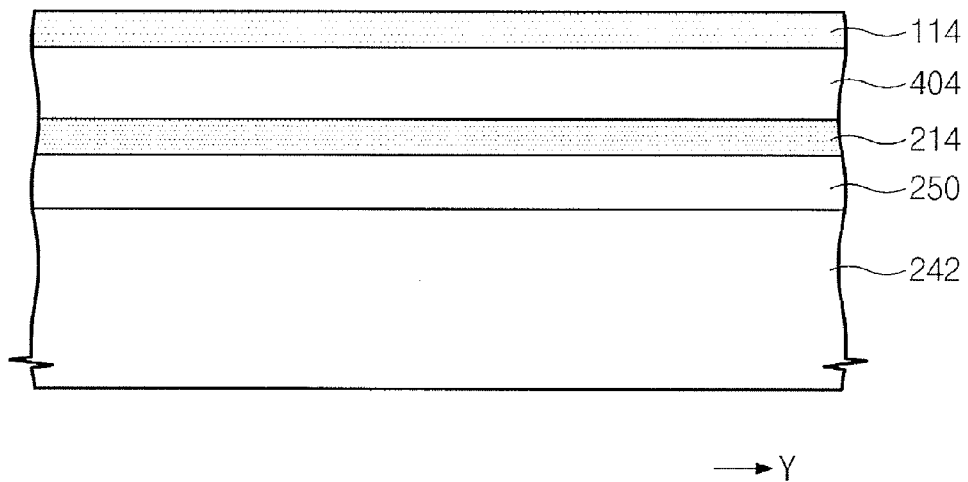

Referring to FIGS. 6A and 6B, a first mask pattern (not shown) is formed on the upper quantum dot layer 112 of FIGS. 5A and 5B. After coating resist on the upper quantum dot layer 112, the first mask pattern may be formed by patterning the resist.

Using the first mask pattern as an etch mask, the upper quantum dot layer 112, the first insulation layer 402, and the lower silicon layer 212 are etched to form a preliminary first insulation pattern 404 and a preliminary lower silicon pattern 214. The etching process may be an anisotropy dry etch process.

The upper quantum dot pattern 114, the preliminary first insulation pattern 404, and the preliminary lower silicon pattern 214 may have a first nano line shape NA on the lower gate insulation layer 250. The first nano line shape NA has the first width W1 in the first direction X and may expand in the second direction Y perpendicular to the first direction X. The first width WI may be less than about 20 nm.

Figure 7A:
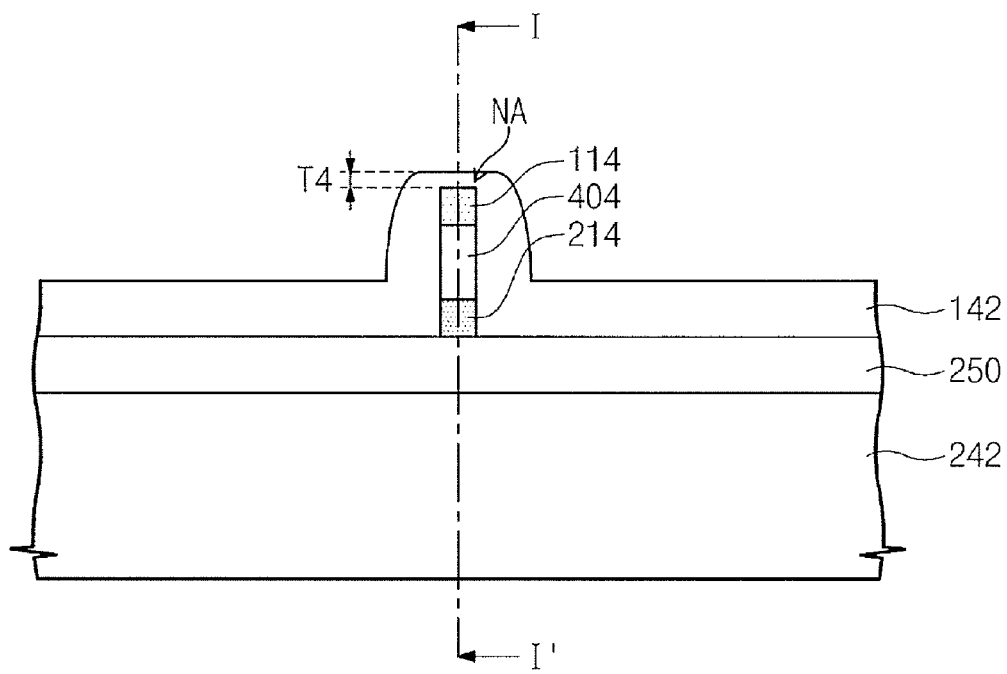
Figure 7B:
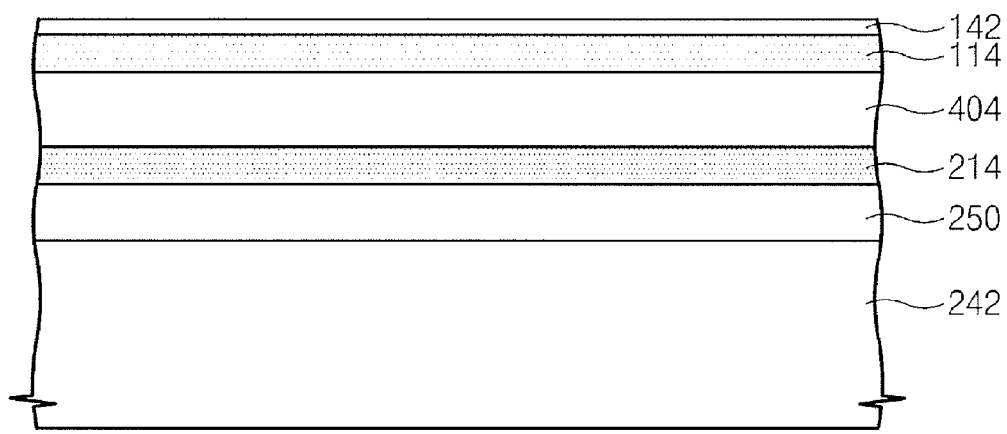

Referring to FIGS. 7A and 7B, a tunnel insulation layer 142 is formed on the lower gate insulation layer 250 to cover the nano line shape NA. The tunnel insulation layer 142 may be formed of a TEOS layer. The tunnel insulation layer 142 may have the thickness T4 of less than about 4 nm on the upper quantum dot pattern 114. The tunnel insulation layer 142 having the thickness T4 may be used as a tunneling layer of charges.

For example, after an insulation layer is formed with the thickness of about 10 nm along the outline of the lower gate insulation layer 250 and the nano line shape NA, a planarization process is performed on the insulation layer to form a tunnel insulation layer 142. The planarization process may be a chemical mechanical polishing (CMP) process. Through the planarization process, the tunnel insulation layer 142 may have the thickness of less than about 4 nm on the upper quantum dot pattern 114. The tunnel insulation layer 142 having the thickness T4 may be used as a tunneling layer of charges.

Figure 8A:
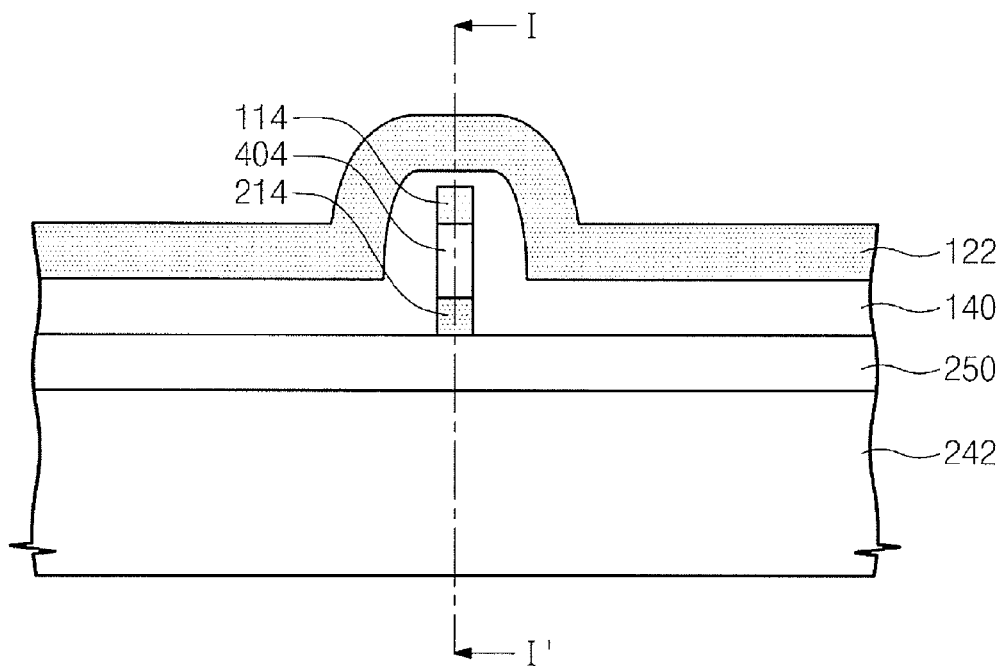
Figure 8B:
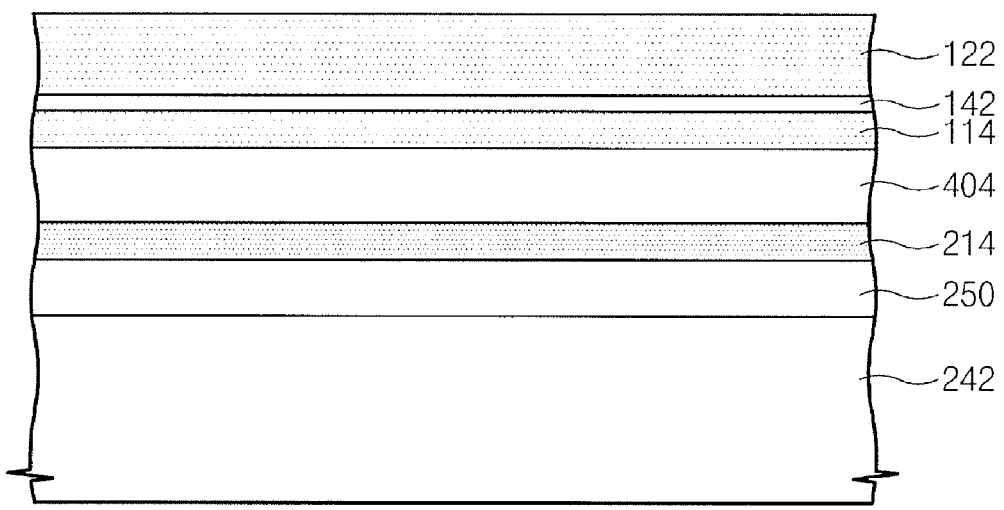

Referring to FIGS. 8A and 8B, a charge storage gate layer 122 is formed on the tunnel insulation layer 142. The charge storage gate layer 122 may be formed of polysilicon by performing a CVD process. The charge storage gate layer 122 may be formed with the uniform thickness along the outline of the tunnel insulation layer 142.

Figure 9A:
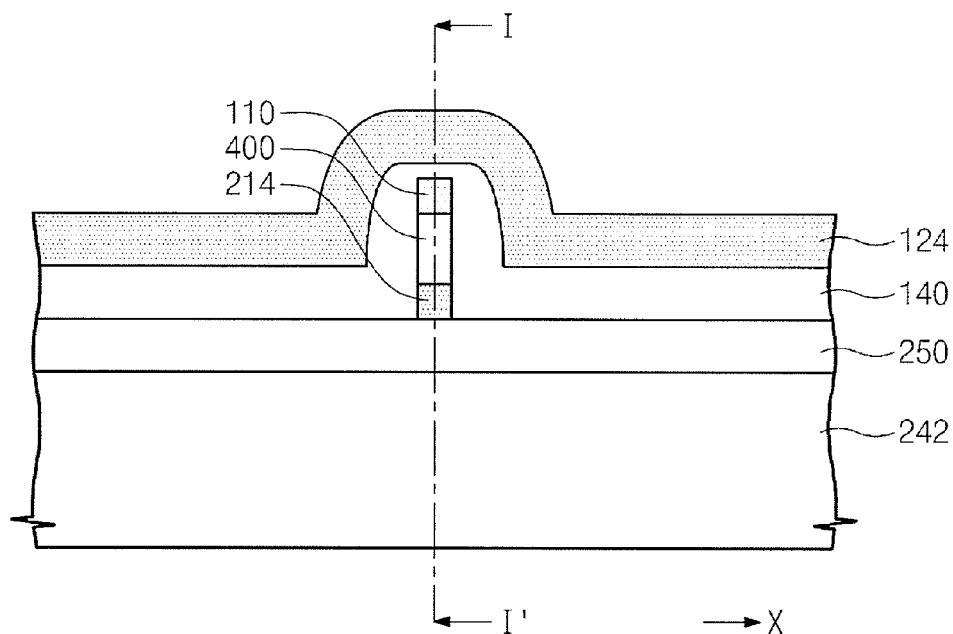
Figure 9B:
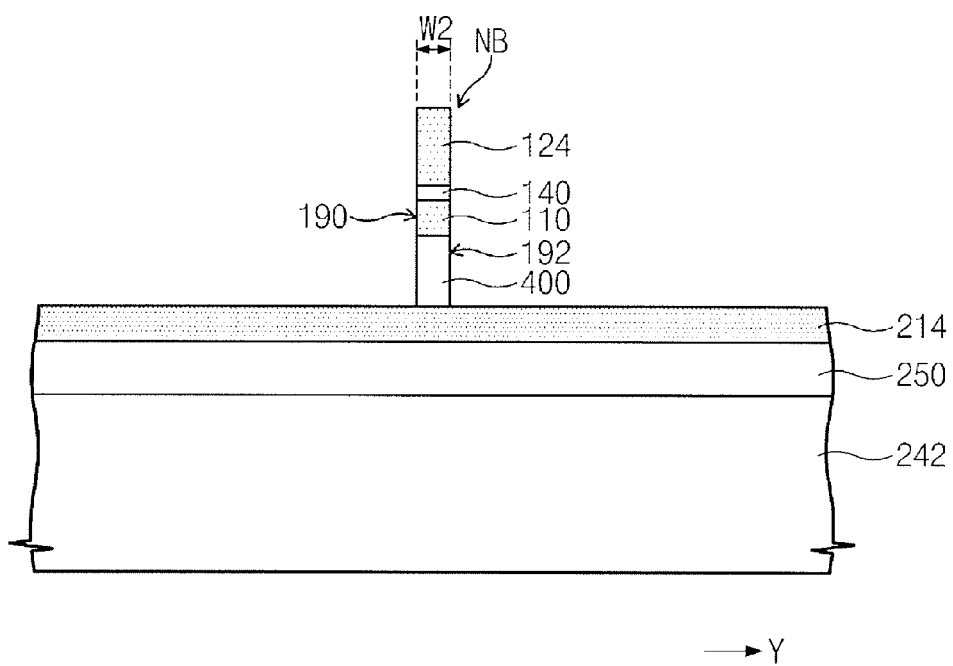

Referring to FIGS. 9A and 9B, a second mask pattern (not shown) is formed on the charge storage gate layer 122 of FIGS. 8A and 8B. After coating resist on the charge storage gate layer 122, the second mask pattern may be formed by patterning the resist.

Using the second mask pattern as an etch mask, the charge storage gate layer 122, the tunnel insulation layer 142, the upper quantum dot pattern 114, and the preliminary first insulation pattern 404 on the lower gate insulation layer 250 are anisotropically dry-etched to form a charge storage gate pattern 124, a tunnel insulation pattern 140, an upper quantum dot 110, and a first insulation pattern 400. The anisotropic dry etch may be performed using different various etch gas.

The charge storage gate pattern 124, the tunnel insulation pattern 140, the upper quantum dot 110, and the first insulation pattern 400 may have a second nano line shape NB. The second nano line shape NB has the second width W2 in the second direction Y, and may extend in the first direction X perpendicular to the second direction Y. The second width W2 is below about 20 nm. The second nano line shape NB may have the both sides 190 and 192 facing each other in the second direction Y. According to the present invention, the upper quantum dot 110 may have the first width WI of FIGS. 6A and 6B and the second width W2.

Figure 10A:
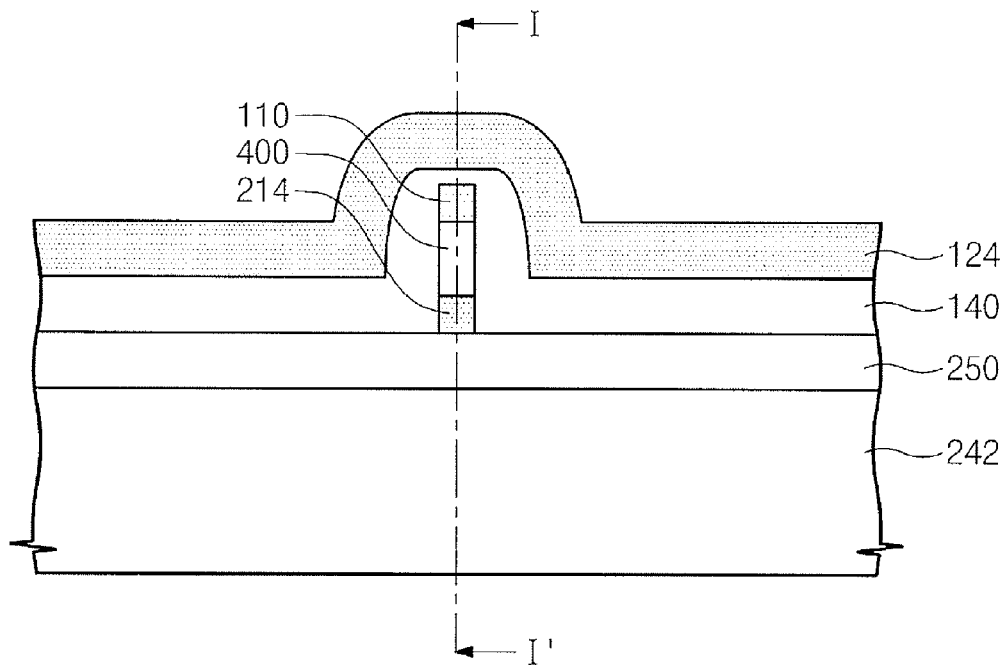
Figure 10B:
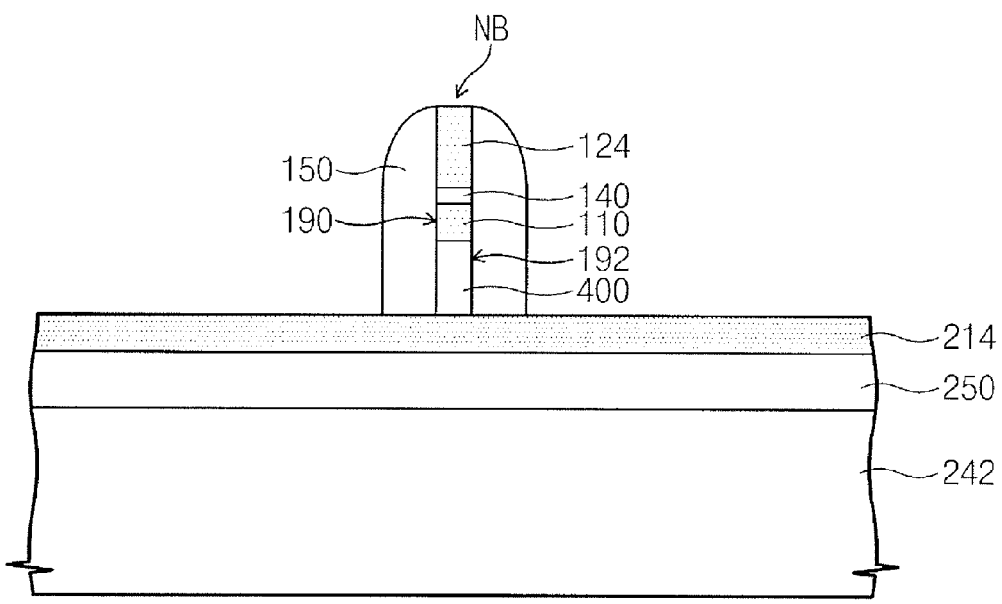

Referring to FIGS. 10A and 10B, the sidewall insulation layer 150 exposing the storage gate pattern 124 and the preliminary lower silicon pattern 214 is formed by covering the both sides 190 and 192 of the second nano line shape NB and the preliminary lower silicon pattern 214 adjacent to the both sides.

For example, after forming the insulation layer that covers the second nano line shape NB, an anisotropic etch process is performed on the insulation layer to form the sidewall insulation layer 150. The insulation layer may be formed of a TEOS layer. The anisotropic etch process is performed until the top surface of the preliminary lower silicon pattern 214 and the charge storage gate pattern 124 is exposed.

Figure 11A:
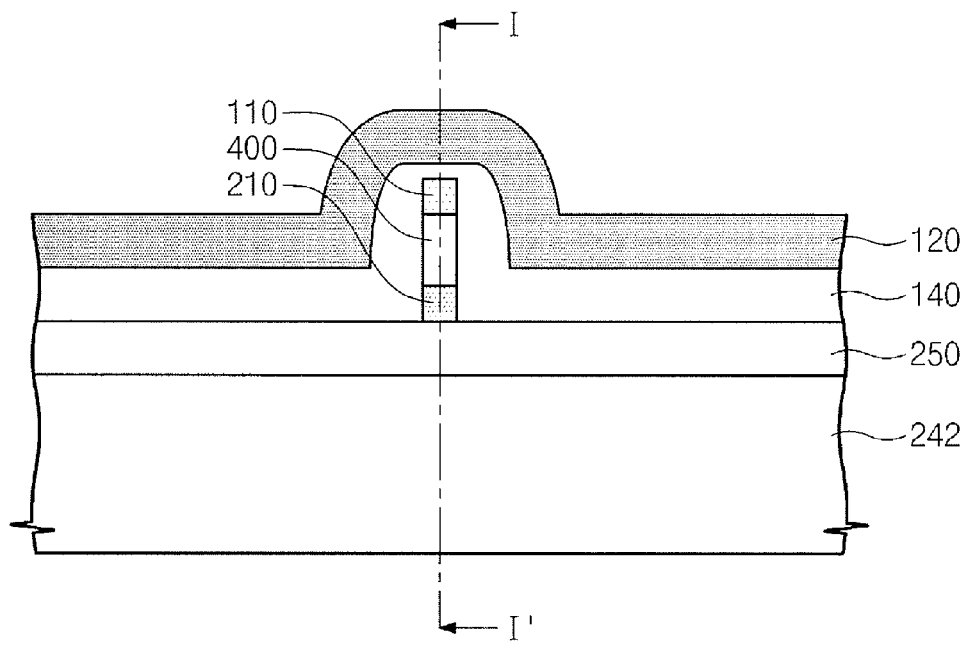
Figure 11B:
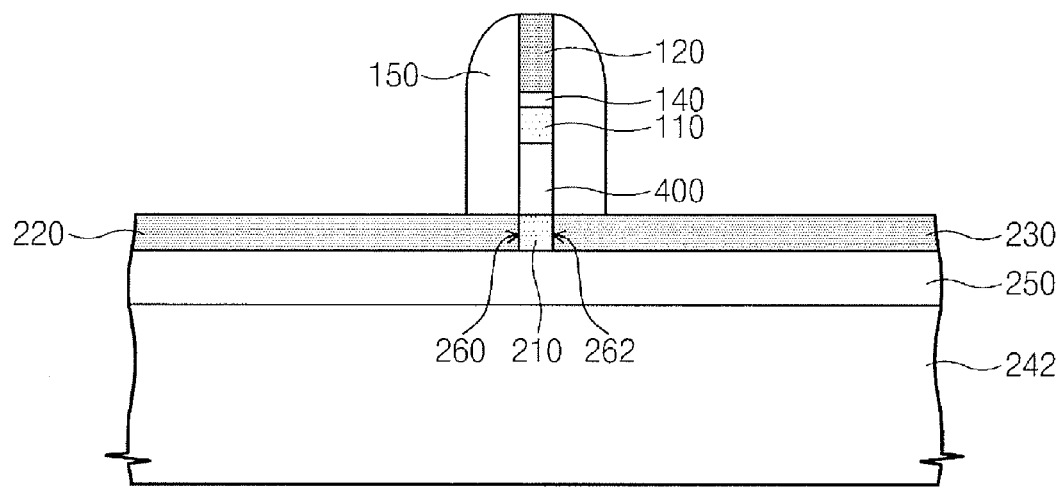

Referring to FIGS. 11A and 11B, a self-aligned silicidation process is performed on the charge storage gate pattern 124 and the preliminary lower silicon pattern 214 of FIGS. 10A and 10B, all of which are exposed by the sidewall insulation layer 150, in order to form the charge storage gate 120, the lower quantum dot 210, and a source and a drain 220 and 230 contacting the both sides of and the lower quantum dot 210.

For example, the silicidation process includes performing a thermal treatment process on metal (not shown) after depositing the metal on the lower gate electrode layer 242. The metal may include one of Er, Yb, Y, Gd, Tb, Ce, Co, Ni, Ti, Pt, Pb, Ir, and a combination thereof. The metal that does not react is removed by the silicide process.

Through the silicide process, the source 220 and the drain 230 may extend below the sidewall insulation layer 150 because the preliminary silicon pattern 214 below the sidewall insulation layer 150 reacts to the metal. Accordingly, the lower quantum dot 210 is formed below the first insulation pattern 400 and may have the width identical/similar to the second width W2 of FIG. 8B. The lower quantum dot 210 has the first width W1 of FIG. 5A and the thickness T1 of FIG. 4A.

Furthermore, the source and drain 220 and 230 naturally contact the both sides of the lower quantum dot 210, and interfaces 260 and 262 between the lower quantum dot 210 and the source and drain 220 and 230 may form a Schottky barrier. The Schottky barrier may serve as a tunneling barrier.

According to the embodiment of the present invention, the charge storage gate 120, the lower quantum dot 210, the source and drain 220 and 230, and the Schottky barrier are simultaneously formed through the silicide process. Accordingly, processes of manufacturing and integrating a semiconductor device are accomplished without difficulties by using silicon technology.

Figure 12A:
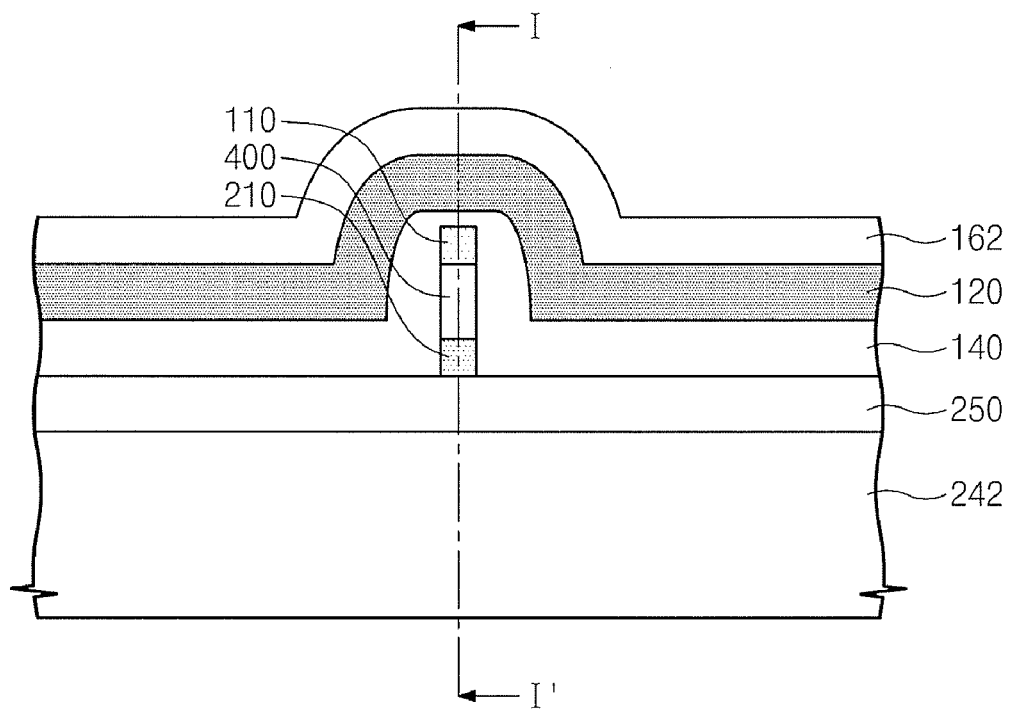
Figure 12B:
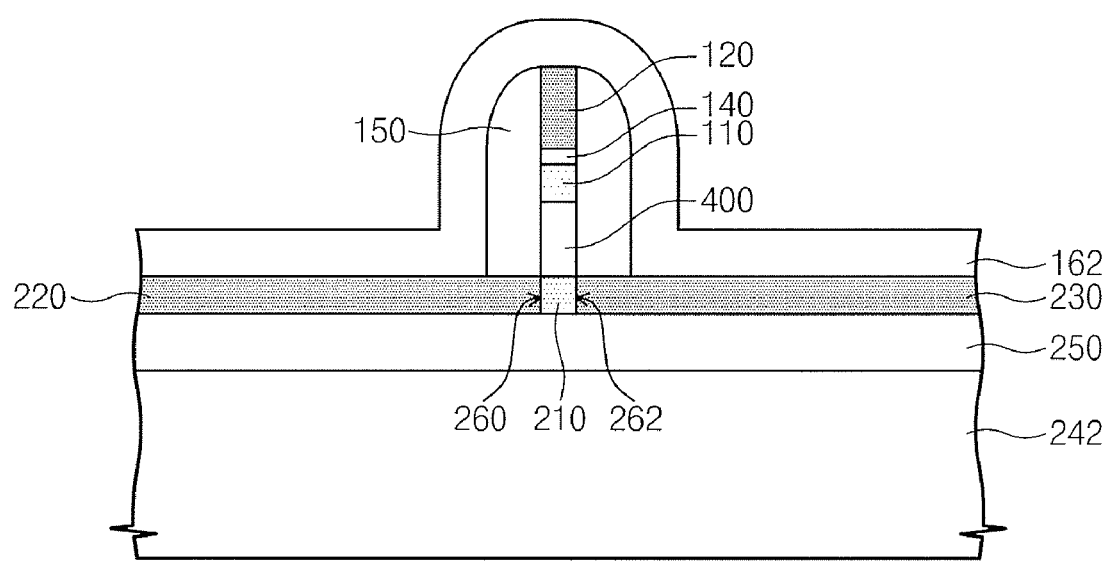

Referring to FIGS. 12A and 12B, a second insulation layer 162 is formed on the lower gate electrode layer 242 to cover the charge storage gate 120 and the source and drain 220 and 230. The second insulation layer 162 may be formed of a TEOS layer.

Figure 13A:
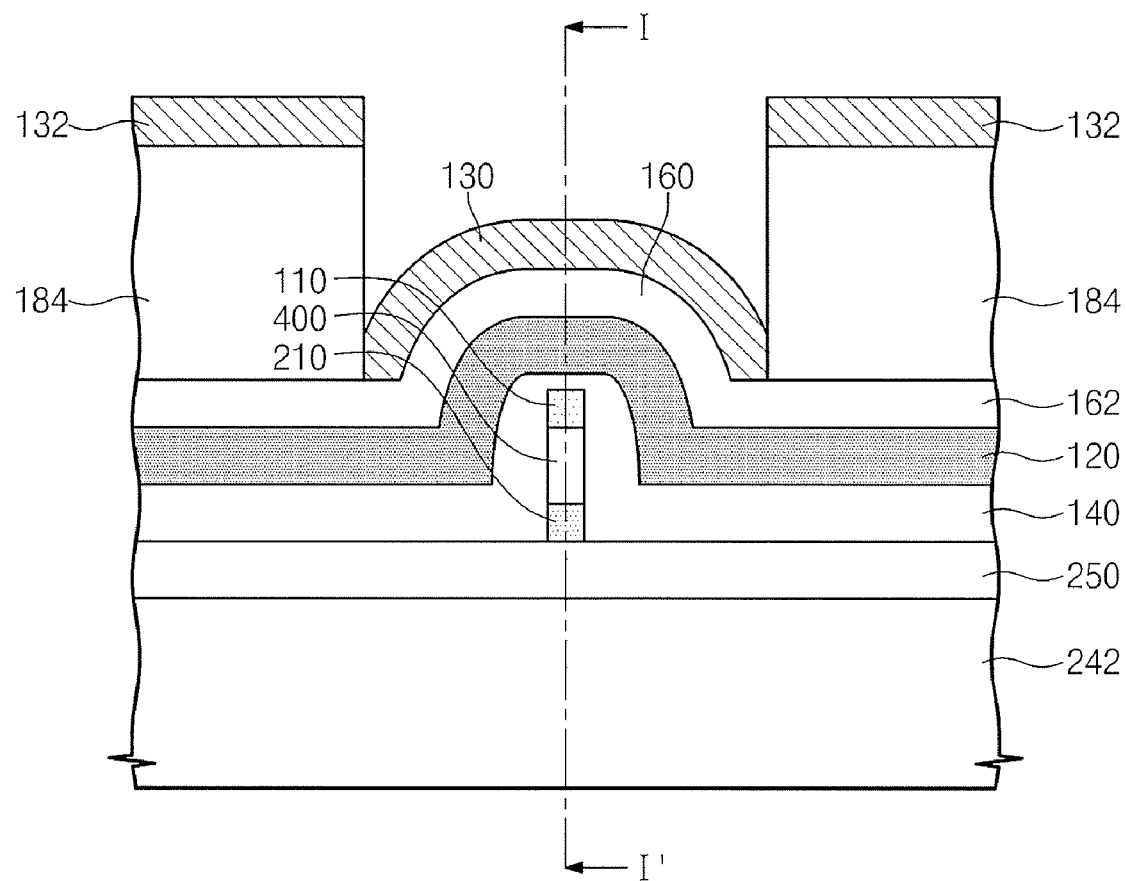
Figure 13B:
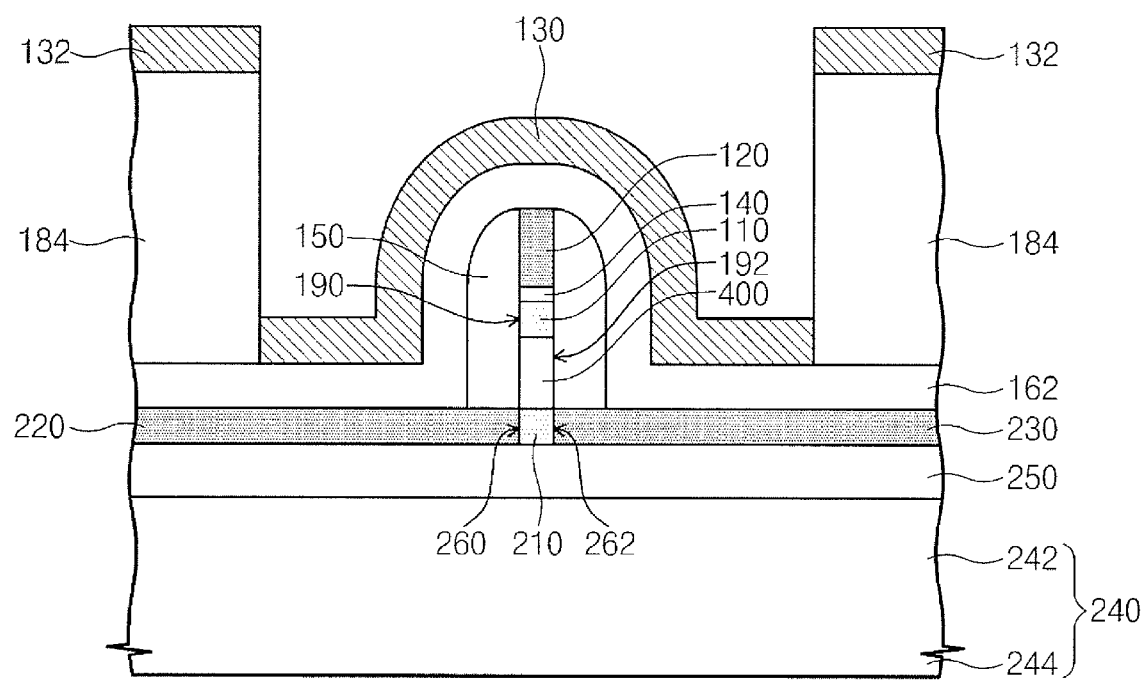

Referring to FIGS. 13A and 13B, a third mask pattern 184 is formed on the charge storage gate 120 to expose the second insulation layer 162. The exposed area of the second insulation layer 162 may be an area where the following upper gate electrode 130 may be formed. After coating resist on the charge storage gate 120, the third mask pattern 184 may be formed by patterning the resist.

Metal 132 is deposited on the lower gate electrode layer 242 where the third mask pattern 184 is formed in order to form the upper gate electrode 130 on the exposed second insulation layer 162. The upper gate electrode 134 may include Al, Cu, W or ITO.

Figure 14A:
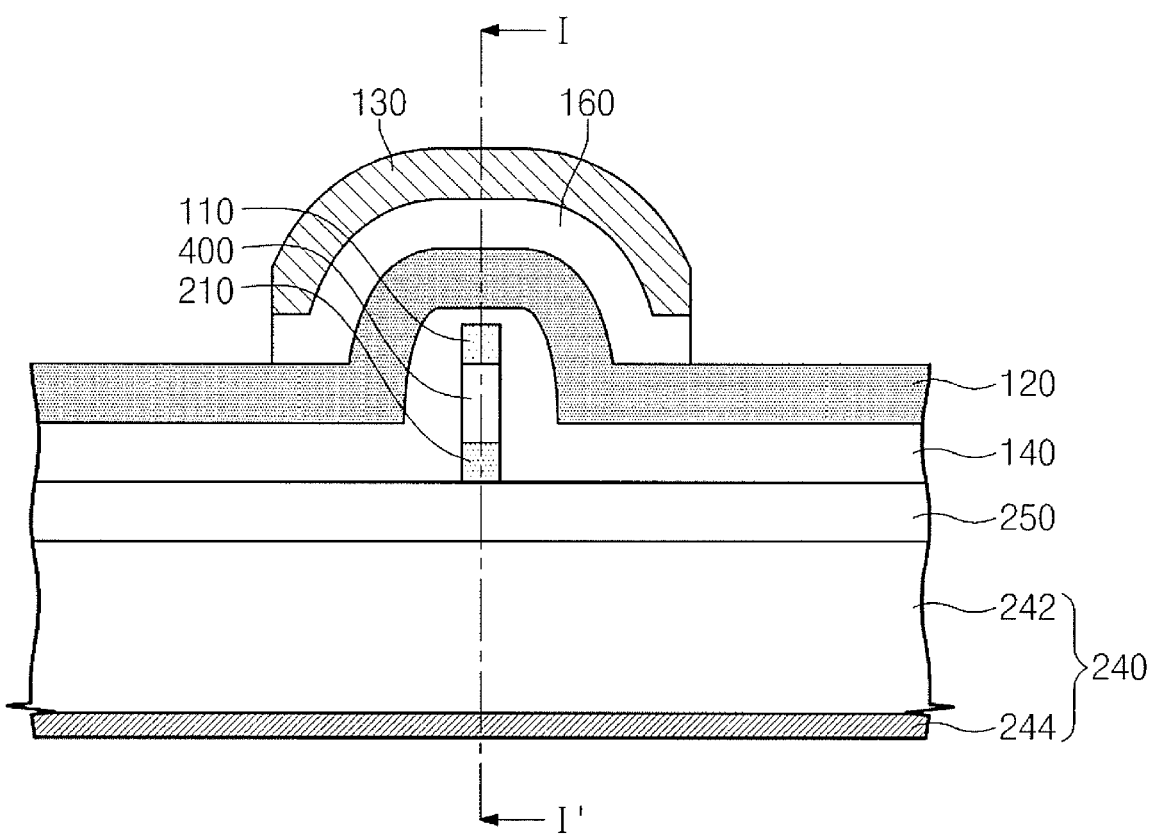
Figure 14B:
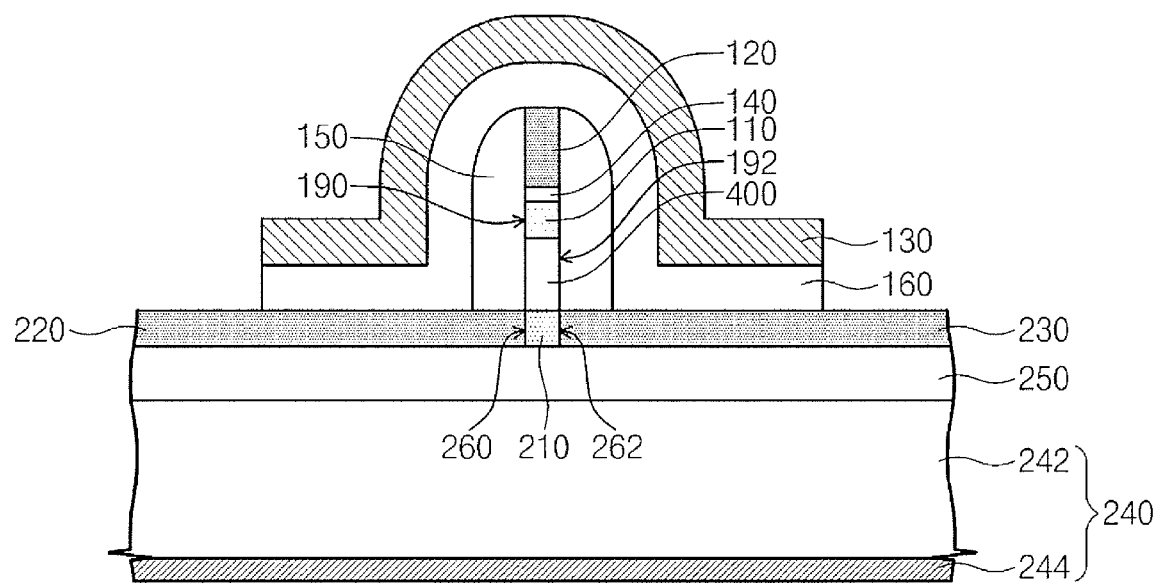

Referring to FIGS. 14A and 14B, after forming the upper gate electrode 130, a lift-off process is performed on the third mask pattern 184 of FIG. 13A and FIG. 13B to remove the third mask pattern 184 and the metal 132 remaining on the third mask pattern 184.

By removing the second insulation layer 162 of FIG. 13A and FIG. 13B below the upper gate electrode 130, a second insulation pattern 160 is formed between the upper gate electrode 130 and the charge storage gate 120. The second insulation pattern 160 may be selectively etched using an etch gas or an etchant having an etch selectivity with respect to the second insulation layer 162 compared to the upper gate electrode 130. The source and drain 220 and 230 and the charge storage gate 120 may be exposed by the second insulation pattern 160.

A gate electrode contact layer 244 may be formed on the lower surface of the lower gate electrode layer 242 in order for resistance contact. The lower gate electrode 240 may include the lower gate electrode layer 242 and the gate electrode contact layer 244.

According to the embodiment of the present invention, a semiconductor device capable of detecting a very small charge quantity induced by a single photon and a method of fabricating the same.

According to the embodiment of the present invention, processes of manufacturing and integrating a semiconductor device are accomplished without difficulties by using silicon technology.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
    a single electron box comprising:
        a first quantum dot,
        a charge storage gate on the first quantum dot,
        a first gate electrode on the charge storage gate, and
        a tunnel insulation layer between the charge storage gate and the first quantum dot; and
    a single electron transistor comprising:
        a second quantum dot below the first quantum dot,
        a source,
        a drain,
        a second gate electrode below the second quantum dot, and
        a gate insulation layer interposed between the source and the second gate electrode, between the drain and the second gate electrode, and between the second quantum dot and the second gate electrode wherein the source/drain comprise silicide and the charge storage gate comprises silicide.

2. The semiconductor device of claim 1, wherein the first quantum dot comprises polysilicon and the second quantum dot comprises crystalline silicon.

3. The semiconductor device of claim 1, wherein:
    the first quantum dot or the charge storage gate is configured to receive an incident single photon; and
    the semiconductor device is configured to detect the single photon by sensing a change of conductivity of a single electron transistor through a change of electric potential of the second quantum dot according to a change of charge quantity of the first quantum dot due to the single photon.

4. The semiconductor device of claim 1, wherein the first quantum dot has a first width in a first direction and a second width in a second direction perpendicular to the first direction.

5. The semiconductor device of claim 4, wherein the second quantum dot has the same widths as the first width and the second width.

6. The semiconductor device of claim 5, wherein each of the first and second widths is less than about 20 nm.

7. The semiconductor device of claim 5, wherein each of the first and second quantum dots has a thickness of less than about 20 nm.

8. The semiconductor device of claim 1, wherein the tunnel insulation layer has a thickness of less than about 4 nm on the first quantum dot.

9. The semiconductor device of claim 1, wherein the single electron box further comprises a second insulation layer between the first gate electrode and the first quantum dot.

10. The semiconductor device of claim 1, wherein interfaces between the source/drain and the second quantum dot are formed of a Schottky barrier.

11. The semiconductor device of claim 1, further comprising a first insulation layer interposed between the first and second quantum dots and capacitively coupling the first and second quantum dots.

12. The semiconductor device of claim 1, wherein the first insulation layer is aligned to the first quantum dot and the second quantum dot is disposed below the first insulation layer, the first insulation layer having a thickness of about 4 nm to about 10 nm.

13. A semiconductor device comprising:
a light detecting unit including a single electron transistor, the single electron transistor including a second gate electrode, a second quantum dot on the second gate electrode, and source/drain contacting both sides of the second quantum dot, respectively;
a light receiving unit including a single electron box, the single electron box including a first quantum dot on the second quantum dot, a charge storage gate on the first quantum dot, and a first gate electrode on the charge storage gate;
a first insulation layer interposed between the first and second quantum dots and capacitively coupling the first and second quantum dots; and
an light incident unit including an optical element and a light adjusting element and being adjacent to the light receiving unit to allow a single photon to be locally incident to the light receiving unit, the optical element irradiating light, the optical adjusting element having a smaller aperture than a wavelength of the light.

14. The semiconductor device of claim 1, further comprising a light incident unit.

15. The semiconductor device of claim 14, wherein the light incident unit comprises an optical element; and an aperture.

16. The semiconductor device of claim 13, further comprising a light incident unit.

17. The semiconductor device of claim 16, wherein the light incident unit comprises an optical element; and an aperture.

18. A semiconductor device comprising:
a single electron box comprising:
a first quantum dot having a first width in a first direction and a second width in a second direction perpendicular to the first direction,
a charge storage gate on the first quantum dot,
a first gate electrode on the charge storage gate, and
a tunnel insulation layer between the charge storage gate and the first quantum dot; and
a single electron transistor comprising
a second quantum dot below the first quantum dot wherein the second quantum dot has the same widths as the first width and the second width,
a source,
a drain,
a second gate electrode below the second quantum dot, the source contacting one side of the second quantum dot, the drain contacting the other side facing the one side, the second gate electrode adjusting electric potential of the second quantum dot,
a gate insulation layer interposed between the source and the second gate electrode, between the drain and the second gate electrode, and between the second quantum dot and the second gate electrode.

19. The semiconductor device of claim 18, further comprising a light incident unit comprising an optical element and an aperture.

20. The semiconductor device of claim 18, further comprising a first insulation layer interposed between the first and second quantum dots and capacitively coupling the first and second quantum dots.

* * * * *